United States Patent [19]
Eneerson et al.
[11] 3,849,736
[45] Nov. 19, 1974

[54] FREQUENCY SYNTHESIZER HAVING FREQUENCY CONTROL LOOP WITH KEYED FIXED FREQUENCY OSCILLATOR

[75] Inventors: Donald W. Enerson, New Brighton; Glenn R. Warfield, New Hope, both of Minn.

[73] Assignee: Dana Corporation, Toledo, Ohio

[22] Filed: Nov. 19, 1973

[21] Appl. No.: 417,063

[52] U.S. Cl. ........................ 331/1 A, 331/25, 331/34
[51] Int. Cl. ............................................ H03b 3/04
[58] Field of Search .................. 331/1 A, 18, 25, 34

[56] References Cited
UNITED STATES PATENTS 3,337,814 8/1967 Brase et al. .................... 331/1 A X
3,551,826 12/1970 Sepe .............................. 331/1 A X
3,579,281 5/1971 Kam et al. ...................... 331/1 A X

*Primary Examiner*—Herman Karl Saalbach
*Assistant Examiner*—Siegfried H. Grimm
*Attorney, Agent, or Firm*—Owen & Owen

[57] ABSTRACT

An improved frequency synthesizer capable of generating a pulse train having a frequency which is the Nth discrete increment of a reference frequency. The synthesized frequency equals the product of the reference frequency times a preselected constant N and divided by a fixed constant K which determines the value of each increment. Circuitry is provided for incrementing N up or down to the preselected value without skipping any increments to obtain a desired output frequency.

5 Claims, 2 Drawing Figures

FREQUENCY SYNTHESIZER HAVING FREQUENCY CONTROL LOOP WITH KEYED FIXED FREQUENCY OSCILLATOR

BACKGROUND OF THE INVENTION

This invention relates to frequency synthesizers and more particularly to an improved frequency synthesizer for generating a pulse train having a frequency which is a preselected discrete increment of a reference frequency.

In the data processing arts and the electronic control arts, it is sometimes desirable to have a frequency synthesizer capable of generating a pulse train having an output frequency which may be synchronized with a reference frequency and varied over a range in discrete increments, such as 10 Hz. or 30 Hz. increments. It is, for example, sometimes desirable to control several motors which, although operating at different speeds, are synchronized. A typical requirement for synchronized motors is in a production line where various operations may take place at different rates. Such operations must be synchronized with other operations in the production line for maximum efficiency and to prevent a faulty operation. A single reference signal is sometimes used to synchronize the various operations.

One type of frequency synthesizer known in the prior art is disclosed in U.S. Pat. No. 3,337,814 which issued on Aug. 22, 1967 to Douglas R. Brase et al. This type of frequency synthesizer employs a phase locked loop including means by which the output frequency is divided down to a feedback frequency, corresponding to the output step frequency, which is compared with a like reference frequency in a phase comparator. The phase comparator output supplies an error voltage which controls a voltage controlled oscillator to generate the output frequency. A closed loop is thus formed from the output back through the phase comparator which in turn generates the error signal when the output frequency varies from a preselected value. However, circuits of this type have not been provided with controls for readily changing the output frequency to obtain a desired output frequency or with means for easily determining an increment in which the output frequency is varied.

SUMMARY OF THE INVENTION

According to the present invention, a closed loop frequency synthesizer is provided with controls for incrementally changing the synthesized output frequency to a desired frequency. A closed phase locked loop is used for multiplying a reference frequency from a reference oscillator or other reference pulse source by a number N to obtain an intermediate frequency signal. The closed phase locked loop is obtained by taking the intermediate frequency signal and dividing it by a preselected number N to obtain a resultant frequency. A frequency comparator compares the reference frequency with the resultant frequency and generates an error pulse signal. The error pulse signal keys a fixed frequency oscillator which generates the intermediate frequency signal. A closed loop is thus formed from the output of the keyed oscillator back through the divider and the frequency comparator. The intermediate frequency signal, which is equal to N times the reference frequency from the reference oscillator, is divided by a constant K for obtaining the output frequency.

The output frequency is varied by selecting a fixed constant K and selectively changing N. This is accomplished by supplying the number N from a counter to a programmable divider which divides the intermediate frequency by the number N. A gate control is connected to selectively connect the output of a ramp oscillator to up or down inputs of the counter which stores the number N. The gate control may be operated to cause the ramp oscillator to increment the counter either up or down to obtain a desired number N.

Accordingly, it is a preferred object of the invention to provide an improved frequency synthesizer.

Another object of the invention is to provide a frequency synthesizer in which an output frequency may be readily incremented up or down in discrete increments of a reference frequency without skipping any increments.

Other objects and advantages of the invention will be apparent from the following detailed description, with reference being made to the accompanying drawing.

DESCRIPTION OF THE PREFERRED EMBODIMENT

Figure 1:
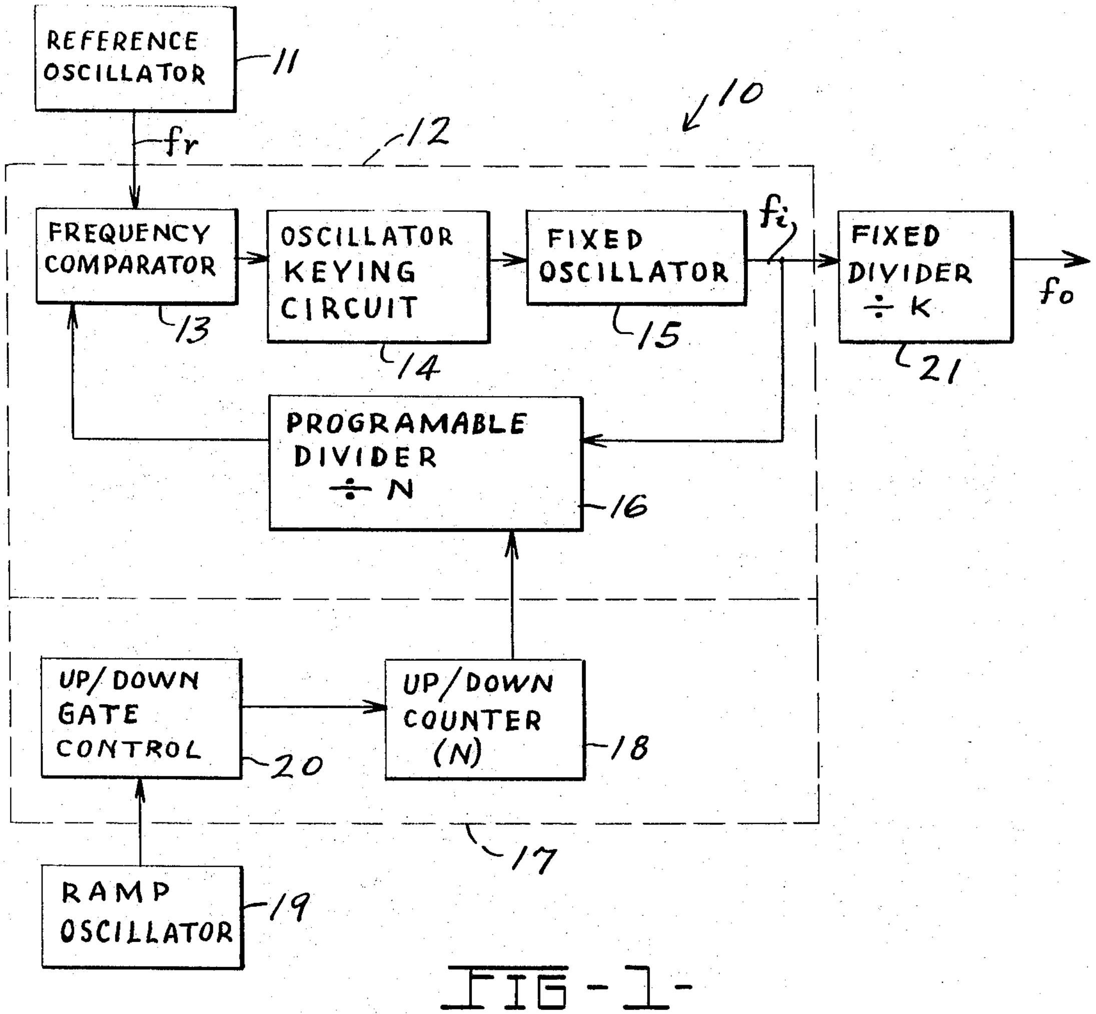
FIG. 1 shows a schematic block diagram of a digital frequency synthesizer constructed in accordance with the present invention.

Turning now to FIG. 1, a block diagram is shown of apparatus 10 for synthesizing from a reference frequency a pulse train having a frequency which is a predetermined Nth increment of the reference frequency. The reference frequency is provided either by a reference oscillator 11 or by some other suitable source and is preferably in the form of a pulse signal which will hereinafter be referred to as $f_r$. The apparatus 10 synthesizes an output frequency or pulse train, hereinafter referred to as $f_o$, which is equal to $f_r$ times a predetermined number N and divided by a constant K. By selecting the value of the input frequency $f_r$ from the reference oscillator 11 and the constant K, the output $f_o$ may be varied over a desired range in increments having any desired value.

A phase locked closed loop 12, as shown in dashed lines, is used for generating an intermediate frequency, hereinafter referred to as $f_i$, which is equal to the product of the input frequency $f_r$ times the number N. The closed loop 12 includes a frequency comparator 13, an oscillator keying circuit 14, an oscillator 15 and a programmable divider 16. The oscillator 15 has a fixed frequency which is equal to or greater than N times the reference frequency $f_r$ for all values of N. The intermediate frequency $f_i$ is obtained at the output of the keyed oscillator 15. This intermediate frequency $f_i$ is applied to an input to the programmable divider 16, which divides the intermediate frequency $f_i$ by N to obtain a resultant frequency. The resultant frequency from the programmable divider 16 is applied to one input of the frequency comparator 13. The frequency comparator 13 compares this resultant frequency with the reference frequency $f_r$ from the oscillator 11 and generates an error signal as long as there is any deviation between the frequencies of the two signals being compared. The error signal from the frequency comparator 13 is applied to the keying circuit 14 which generates a signal for keying the oscillator 15 on when there is a difference between the compared frequencies. The intermediate frequency $f_i$ appears at the output of the keyed oscillator 15. The phase locked closed loop 12 results in the intermediate frequency $f_i$ having a pulse count equal to N times the pulse count of the reference frequency $f_r$. Various devices are available for performing the functions of the frequency comparator 13 and the keying circuit 14. These functions may, for example, be performed by a Motorola No. 4044 TTL integrated circuit connected to an integrated circuit operational amplifier.

As previously stated, the programmable divider 16 divides the intermediate frequency $f_i$ from the fixed oscillator 15 by the number N. The programmable divider 16 may consist of one or more commercially available integrated circuit dividers. Such dividers have a binary input, which may be in a BCD or binary coded decimal format, for receiving the number N by which an input pulse train is divided. The number N is provided to the programmable divider 16 from a ratio control circuit 17. The ratio control circuit 17 includes an up/down counter 18 which is counted up to and stores the number N. The counter 18 is counted up or down in one digit increments to provide a continuous incremental control over the number N. Counting of the counter 18 is accomplished by means of a ramp oscillator 19 and an up/down gate control 20. The gate control 20 may be in the form of a manually controlled switch, for example, for selectively applying the ramp output pulses from the oscillator 19 to the up input of the counter 18 for incrementing N upwardly or for applying the ramp output pulses from the oscillator 19 to a down input to the counter 18, incrementing N downwardly. The frequency of the ramp oscillator 19 should be sufficiently low as to permit incrementing or decrementing the up/down counter 18 to any desired value for the number N by manually operating the gate control 20 to apply ramp pulses to the desired input of the counter 18.

The output frequency $f_o$ from the frequency synthesizing apparatus 10 is obtained by dividing the intermediate frequency $f_i$ by the constant K which must be greater than or equal to N. This is achieved by a fixed frequency divider 21. As with the programmable divider 16, the frequency divider 21 may consist of one or more integrated circuit dividers connected to divide by K. Thus, the output frequency $f_o$ equals the intermediate frequency $f_i$ divided by the constant K which is in turn equal to the input frequency $f_r$ from the reference oscillator 11 times the number N and divided by the constant K.

Figure 2:
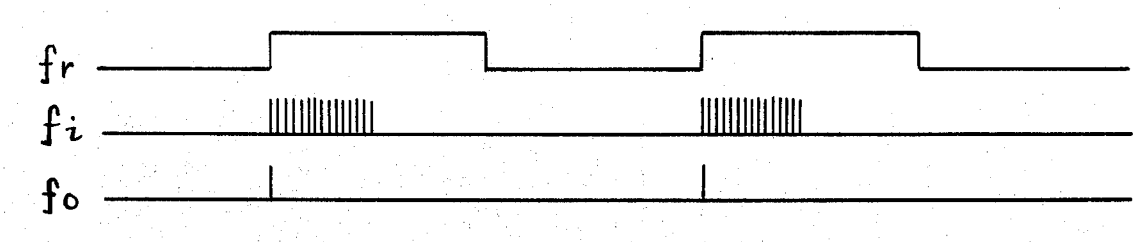
FIG. 2 is a graph showing the relationship between signals appearing at different points in the circuit of FIG. 1.

The operation of the frequency synthesizing apparatus 10 may be more readily understood by referring to the graph of FIG. 2. The graph represents the signals $f_r$, $f_i$ and $f_o$ with both K and N set at the number 15. At the beginning of each pulse or cycle in $f_r$ from the reference oscillator 11, the fixed oscillator 15 is turned on. The fixed oscillator 15 will then remain on until the intermediate frequency $f_i$ totals a "burst" of 15 pulses at which time the programmable divider 16 will apply a single pulse to the comparator 13 which turns off the oscillator 15 until the next pulse is received from the reference oscillator 11. The fixed divider 21 may be adapted to generate an output pulse at either the leading or first of each K pulses in $f_i$ or on the last of each K pulses. As shown in FIG. 2, the output $f_o$ is formed by generating a pulse on the occurrence of the first of each K pulses in the intermediate signal $f_i$. Since K and N are equal, the frequencies $f_r$ and $f_o$ are also equal. However, $f_o$ will have an appreciably narrower pulse width than $f_r$.

The fixed constant K determines the change in the output frequency $f_o$ as a percentage of the input frequency $f_r$ for each increment or decrement of the number N. If, for example, the constant K equals 1,000, then the output frequency $f_o$ may be varied in increments of 0.1 percent of theinput frequency $f_r$. If it is then assumed that the reference oscillator 11 generates a frequency $f_r$ equal to 10 kHz., then the output frequency $f_o = 10,000 \times N/1,000$ or the output frequency will equal 10N. Thus, if N equals 95, then the output frequency $f_o$ equals 950 Hz. If N is then changed to 96, $f_o$ will be incremented by 10 Hz. to 960 Hz.

Of course, it will be appreciated that other incremental changes in the output frequency $f_o$ may be made merely by changing the input frequency $f_r$ and the constant K. By changing the input frequency $f_r$ from the reference oscillator 11 to 25 kHz. and leaving the constant K at 1,000, for example, the output frequency $f_o$ will be changed in 25 Hz. increments since $f_r$ divided by K equals 25,000/1,000 or 25. Thus, if the number N stored in the counter 18 equals 40, then the output frequency $f_o$ will equal 1,000 Hz. By decrementing N to 39 or incrementing N to 41, the output frequency $f_o$ will change to 975 Hz. or to 1,025 Hz., respectively. From the foregoing examples, it will be appreciated that the selection of the constant K and the input frequency $f_r$ from the reference oscillator 11 permit synthesizing an output signal having a frequency $f_o$ which may be changed by increments having any desired value. The actual output frequency $f_o$ is then readily selected merely by setting the desired number N in the counter 18.

It will be appreciated that various modifications and changes may be made in the above-described frequency synthesizing apparatus without departing from the spirit and the scope of the claimed invention.

What we claim is:

1. Apparatus for synthesizing from a reference signal a pulse train having an output frequency which is a predetermined Nth increment of the reference signal comprising, in combination, oscillator means for generating an intermediate signal, programmable divider means for dividing such intermediate signal by N to obtain a resultant signal, means for comparing such resultant signal with the reference frequency, means responsive to such comparison for controlling said oscillator means to maintain such intermediate signal N times the reference signal, means for dividing such intermediate signal by a predetermined constant to obtain the output pulse train, such constant determining the fraction of the reference signal for each increment, and means for selecting the Nth increment including a counter, said counter supplying the number N to said dividing means, and means for selectively counting said counter to the predetermined N.

2. Apparatus for synthesizing from a reference signal a pulse train having an output frequency which is a predetermined Nth increment of the reference signal, as set forth in claim 1, wherein said counter has up and down count inputs, and wherein said means for selectively counting said counter includes an oscillator, and gate means for selectively connecting said oscillator to the up and down counter inputs.

3. Apparatus for synthesizing from a reference signal a pulse train having an output frequency which is a predetermined Nth increment of the reference signal, as set forth in claim 2, wherein said oscillator is a ramp oscillator.

4. Apparatus for synthesizing from a reference signal a pulse train having an output frequency which is a predetermined Nth increment of the reference signal, as set forth in claim 2, wherein said oscillator means for generating an intermediate signal is a fixed frequency oscillator having an output frequency greater than N times the frequency of the reference signal, wherein said comparing means generates an error signal when the resultant signal differs in frequency from the reference signal and wherein said controlling means comprises means responsive to said error signal for keying said fixed frequency oscillator.

5. Apparatus for synthesizing from a reference signal a pulse train having a narrow pulse width and an output frequency less than or equal to the frequency of such reference signal, said output frequency comprising the Nth increment of such reference frequency, said apparatus comprising, in combination, oscillator means for generating a fixed frequency intermediate signal which is equal to or greater than N times the frequency of such reference signal, means for dividing pulses in such intermediate signal by N to obtain a resultant signal, means for comparing pulses in such resultant signal with the reference signal, means responsive to such comparison for keying said oscillator means on and off, said keying means keying said oscillator means on as long as said comparing means detects a difference between such resultant signal and such reference signal, and means for dividing pulses in such intermediate signal by a preselected constant equal to or greater than N to obtain the output pulse train.

* * * * *